United States Patent
Jayashankar et al.

(10) Patent No.: US 9,899,043 B2
(45) Date of Patent: Feb. 20, 2018

(54) METHODS OF FORMING NEAR FIELD TRANSDUCERS AND NEAR FIELD TRANSDUCERS FORMED THEREBY

(71) Applicant: SEAGATE TECHNOLOGY LLC, Cupertino, CA (US)

(72) Inventors: Sethuraman Jayashankar, Excelsior, MN (US); Hui Brickner, Bloomington, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/430,584

(22) Filed: Feb. 13, 2017

(65) Prior Publication Data
US 2017/0169842 A1 Jun. 15, 2017

Related U.S. Application Data

(63) Continuation of application No. 14/561,840, filed on Dec. 5, 2014, now Pat. No. 9,570,098.
(Continued)

(51) Int. Cl.
| | |
|---|---|
| G11B 5/31 | (2006.01) |
| C23C 14/16 | (2006.01) |
| C23C 14/48 | (2006.01) |
| C23C 14/04 | (2006.01) |
| C23C 14/06 | (2006.01) |
| G11B 5/00 | (2006.01) |

(52) U.S. Cl.
CPC ............ *G11B 5/3163* (2013.01); *C23C 14/04* (2013.01); *C23C 14/06* (2013.01); *C23C 14/0605* (2013.01); *C23C 14/16* (2013.01); *C23C 14/48* (2013.01); *G11B 5/314* (2013.01); *G11B 2005/0021* (2013.01)

(58) Field of Classification Search
CPC .. G02B 6/00; G11B 2005/0021; G11B 5/314; G11B 5/3163
See application file for complete search history.

(56) References Cited

U.S. PATENT DOCUMENTS

| | | |
|---|---|---|
| 4,492,873 A | 1/1985 | Dmitriev |
| 5,482,611 A | 1/1996 | Helmer |
| (Continued) | | |

FOREIGN PATENT DOCUMENTS

| | | |
|---|---|---|
| EP | 024088 | 10/1987 |
| EP | 0580368 | 1/1994 |
| (Continued) | | |

OTHER PUBLICATIONS

Al-Bayati et al., Junction Profiles of Sub keV Ion Implantation for Deep Sub-Quarter Micron Devices, *IEEE*, 2000, pp. 87-90.
(Continued)

*Primary Examiner* — Dah-Wei D Yuan
*Assistant Examiner* — Kristen A Dagenais
(74) *Attorney, Agent, or Firm* — Mueting, Raasch & Gebhardt, P.A.

(57) ABSTRACT

A method of forming a near field transducer (NFT), the method including the steps of depositing a plasmonic material; depositing an encapsulant material on at least a portion of the plasmonic material; and implanting ions into at least a portion of the plasmonic material through the encapsulant material.

20 Claims, 10 Drawing Sheets

Related U.S. Application Data

(60) Provisional application No. 61/912,798, filed on Dec. 6, 2013, provisional application No. 61/912,899, filed on Dec. 6, 2013.

(56) References Cited

U.S. PATENT DOCUMENTS

| | | |
|---|---|---|
| 5,849,093 A | 12/1998 | Andra |
| 5,945,681 A | 8/1999 | Tokiguchi |
| 6,130,436 A | 10/2000 | Renau |
| 6,144,098 A | 11/2000 | Iyer |
| 6,589,676 B1 | 7/2003 | Gui |
| 6,632,483 B1 | 10/2003 | Callegari |
| 6,641,932 B1 | 11/2003 | Xu |
| 6,683,426 B1 | 1/2004 | Kleeven |
| 6,795,630 B2 | 9/2004 | Challener |
| 6,999,384 B2 | 2/2006 | Stancil |
| 7,002,228 B2 | 2/2006 | Deak |
| 7,018,729 B2 | 3/2006 | Pocker |
| 7,032,427 B2 | 4/2006 | Niwa |
| 7,262,936 B2 | 8/2007 | Hamann |
| 7,272,079 B2 | 9/2007 | Challener |
| 7,330,404 B2 | 2/2008 | Peng |
| 7,377,228 B2 | 5/2008 | Mack |
| 7,476,855 B2 | 1/2009 | Huang |
| 7,538,978 B2 | 5/2009 | Sato |
| 7,544,958 B2 | 6/2009 | Low |
| 7,609,003 B2 | 10/2009 | Horsky |
| 7,690,009 B2 | 3/2010 | Miyanishi |
| 7,791,839 B2 | 9/2010 | Olson |
| 7,961,417 B2 | 6/2011 | Seigler |
| 7,965,464 B2 | 6/2011 | Batra |
| 7,986,592 B2 | 7/2011 | Hirano |
| 8,023,225 B2 | 9/2011 | Shimazawa |
| 8,031,561 B2 | 10/2011 | Hellwing |
| 8,040,761 B2 | 10/2011 | Kawamori |
| 8,077,556 B2 | 12/2011 | Komura |
| 8,107,325 B2 | 1/2012 | Komura |
| 8,116,034 B2 | 2/2012 | Komura |
| 8,116,176 B2 | 2/2012 | Kato |
| 8,194,510 B2 | 6/2012 | Sasaki |
| 8,194,511 B2 | 6/2012 | Sasaki |
| 8,213,272 B2 | 7/2012 | Takayama |
| 8,223,597 B2 | 7/2012 | Komura |
| 8,248,891 B2 | 8/2012 | Lee |
| 8,284,521 B2 | 10/2012 | Ohtsu |
| 8,284,635 B2 | 10/2012 | Matsumoto |
| 8,289,650 B2 | 10/2012 | Seigler |
| 8,320,220 B1 | 11/2012 | Yuan |
| 8,325,567 B2 | 12/2012 | Miyauchi |
| 8,331,205 B2 | 12/2012 | Seigler |
| 8,339,740 B2 | 12/2012 | Zou |
| 8,351,151 B2 | 1/2013 | Katine |
| 8,385,159 B2 | 2/2013 | Gao |
| 8,400,902 B2 | 3/2013 | Huang |
| 8,405,056 B2 | 3/2013 | Amaldi |
| 8,405,932 B2 | 3/2013 | Seigler |
| 8,416,647 B1 | 4/2013 | Zhao |
| 8,427,925 B2 | 4/2013 | Zhao |
| 8,451,555 B2 | 5/2013 | Seigler |
| 8,451,705 B2 | 5/2013 | Peng |
| 8,477,454 B2 | 7/2013 | Zou |
| 8,514,673 B1 | 8/2013 | Zhao |
| 8,553,505 B2 | 10/2013 | Rawat |
| 8,670,215 B2 | 3/2014 | Zou |
| 8,675,457 B1 | 3/2014 | Hirata |
| 8,711,662 B2 | 4/2014 | Lee |
| 8,773,959 B2 | 7/2014 | Gao |
| 8,830,800 B1 | 9/2014 | Pitcher |
| 8,917,581 B1 | 12/2014 | Mallary |
| 8,934,198 B2 | 1/2015 | Zou |
| 8,945,731 B2 | 2/2015 | Zhao |
| 9,245,573 B2 | 1/2016 | Sahoo |
| 2005/0012052 A1 | 1/2005 | Platzgummer |
| 2005/0190496 A1 | 9/2005 | Hamann |
| 2006/0238133 A1 | 10/2006 | Horsky |
| 2007/0069383 A1 | 3/2007 | Suzuki |
| 2008/0230724 A1 | 9/2008 | Low |
| 2009/0073858 A1 | 3/2009 | Seigler |
| 2009/0130365 A1 | 5/2009 | Kojima |
| 2009/0225636 A1 | 9/2009 | Hirano |
| 2010/0103553 A1 | 4/2010 | Shimazawa |
| 2010/0123965 A1 | 5/2010 | Lee |
| 2010/0123967 A1 | 5/2010 | Batra |
| 2010/0128579 A1 | 5/2010 | Seigler |
| 2010/0149930 A1 | 6/2010 | Komura |
| 2010/0157746 A1 | 6/2010 | Hongo |
| 2010/0190036 A1 | 7/2010 | Komvopoulos |
| 2010/0214685 A1 | 8/2010 | Seigler |
| 2010/0309581 A1 | 12/2010 | Wu |
| 2010/0315736 A1 | 12/2010 | Takayama |
| 2010/0320403 A1 | 12/2010 | Amaldi |
| 2010/0329085 A1 | 12/2010 | Kawamori |
| 2011/0006214 A1 | 1/2011 | Bonig |
| 2011/0026161 A1 | 2/2011 | Ikeda |
| 2011/0038236 A1 | 2/2011 | Mizuno |
| 2011/0058272 A1 | 3/2011 | Miyauchi |
| 2011/0096431 A1 | 4/2011 | Hellwig |
| 2011/0122735 A1 | 5/2011 | Kato |
| 2011/0205863 A1* | 8/2011 | Zhao ............... B82Y 10/00 369/13.33 |
| 2012/0045662 A1 | 2/2012 | Zou |
| 2012/0105996 A1 | 5/2012 | Katine |
| 2012/0127839 A1 | 5/2012 | Rawat |
| 2012/0163139 A1 | 6/2012 | Vavra |
| 2012/0201491 A1 | 8/2012 | Zhou |
| 2012/0213042 A1 | 8/2012 | Aoki |
| 2013/0107679 A1 | 5/2013 | Huang |
| 2013/0108212 A1 | 5/2013 | Peng |
| 2013/0161505 A1 | 6/2013 | Pitcher |
| 2013/0164453 A1 | 6/2013 | Pitcher |
| 2013/0164454 A1 | 6/2013 | Pitcher |
| 2013/0176839 A1 | 7/2013 | Peng |
| 2013/0235707 A1 | 9/2013 | Zhao |
| 2013/0279315 A1 | 10/2013 | Zhao |
| 2013/0286799 A1 | 10/2013 | Zhu |
| 2013/0286804 A1 | 10/2013 | Zhao |
| 2013/0288077 A1 | 10/2013 | Dhawan |
| 2014/0004384 A1 | 1/2014 | Zhao |
| 2014/0043948 A1 | 2/2014 | Hirata |
| 2014/0050057 A1 | 2/2014 | Zou |
| 2014/0050058 A1 | 2/2014 | Zou |
| 2014/0113160 A1 | 4/2014 | Pitcher |
| 2014/0177405 A1 | 6/2014 | Rejda |
| 2014/0254335 A1 | 9/2014 | Gage |
| 2014/0376341 A1 | 12/2014 | Wessel |
| 2014/0376342 A1 | 12/2014 | Wessel |
| 2014/0376349 A1 | 12/2014 | Cheng |
| 2014/0376350 A1 | 12/2014 | Cheng |
| 2014/0376352 A1* | 12/2014 | Cheng ............... G11B 5/314 369/13.33 |
| 2015/0132503 A1 | 5/2015 | Kautzky |
| 2015/0162028 A1 | 6/2015 | Jayashankar |
| 2015/0162030 A1 | 6/2015 | Jayashankar |
| 2015/0179194 A1 | 6/2015 | Cheng |
| 2015/0340052 A1 | 11/2015 | Sankar |
| 2016/0133279 A1 | 5/2016 | Zhao |
| 2016/0163139 A1 | 6/2016 | Kankkunen et al. |

FOREIGN PATENT DOCUMENTS

| | | |
|---|---|---|
| EP | 0942072 | 9/1999 |
| EP | 1328027 | 7/2003 |
| EP | 2106678 | 10/2009 |
| JP | 2011198450 | 10/2011 |
| JP | 20111238991 | 10/2011 |
| TW | 200929183 | 7/2009 |
| WO | WO 97/45834 | 12/1997 |

(56) References Cited

FOREIGN PATENT DOCUMENTS

| WO | WO 2013/163195 | 10/2013 |
|----|----------------|---------|
| WO | WO 2013/163470 | 10/2013 |

OTHER PUBLICATIONS

Angel et al., "Enhanced Low Energy Drift-Mode Beam Currents in a High Current Ion Implanter," *IEEE*, 1999, pp. 219-222.

Bannuru et al., "The Electrical and Mechanical Properties of Au-V and Au-V2O5 Thin Films for Wear-Resistant RF MEMS Switches", *Journal of Applied Physics*, 103, (2008), pp. 083522-1-083522-6.

Challener et al., "Heat-Assisted Magnetic Recording by a Near-Field Transducer with Efficient Optical Energy Transfer," *Journal of Applied Physics*, Mar. 22, 2009.

Druz et al., "Diamond-Like Carbon Films Deposited Using a Broad, Uniform Ion Beam from an RF Inductively Coupled CH4-Plasma Source", Diamond and Related Materials, vol. 7, No. 7, Jul. 1998, pp. 965-972.

Liu et al., "Influence of the Incident Angle of Energetic Carbon Ions on the Properties of Tetrahedral Amorphous Carbon (ta-C) films", *Journal of Vacuum Science and Technology*, vol. 21, No. 5, Jul. 25, 2003, pp. 1665-1670.

Metallization: "Metallization"; chapter 5, In: Kris v. Srikrishnan and Geraldine C. Schwartz: "Handbook of Semiconductor Interconnection Technology, Second Edition", 2006, CRC Press, Boca Raton, FL, USA, XP002711255, ISBN:978-1-4200-1765-6, pp. 311-382, Section 5.4.1.2 Adhesion; p. 320.

PCT International Search Report and Written Opinion for PCT/US2015/059671 dated Apr. 29, 2016 (12 pages).

PCT/US2013/038120 Search Report and Written Opinion dated Jul. 19, 2013 (8 pages).

Piazza et al., "Large Area Deposition of Hydrogenated Amorphous Carbon Films for Optical Storage Disks", Diamond and Related Materials, vol. 13, No. 4-8, Apr. 2004, pp. 1505-1510.

Robertson, J., "Diamond-Like Amorphous Carbon," *Materials Science and Engineering R 37*, 2002, pp. 129-281.

Satoh et al., "Evaluation of Adhesion Materials for Gold Line-and-Space Surface Plasmon Antenna on SO1-MOS Photodiode", Silicon Nanoelectronics Workshop (SNW), 2010, *IEEE*, Piscataway, NJ, USA, Jun. 13, 2010, pp. 1-2.

Vogt, K.W. et al., "Characterization of Thin Titanium Oxide Adhesion Layers on Gold Resistivity, Morphology, and Composition", *Surface Science*, North-Holland, Amsterdam, NL, vol. 301, No. 1-3, Jan. 10, 1994, pp. 203-213.

Weller et al., A HAMR Media Technology Roadmap to an Areal Density of 4 tb/in$^2$, *IEEE Transactions on Magnetics*, vol. 50, No. 1, Jan. 2014.

Williams, et al., "Strengthening Gold Films with Zirconia Nanoparticles for MEMS Electrical Contacts", *ScienceDirect*, Acta Materialia 56, (2008), pp. 1813-1819.

\* cited by examiner

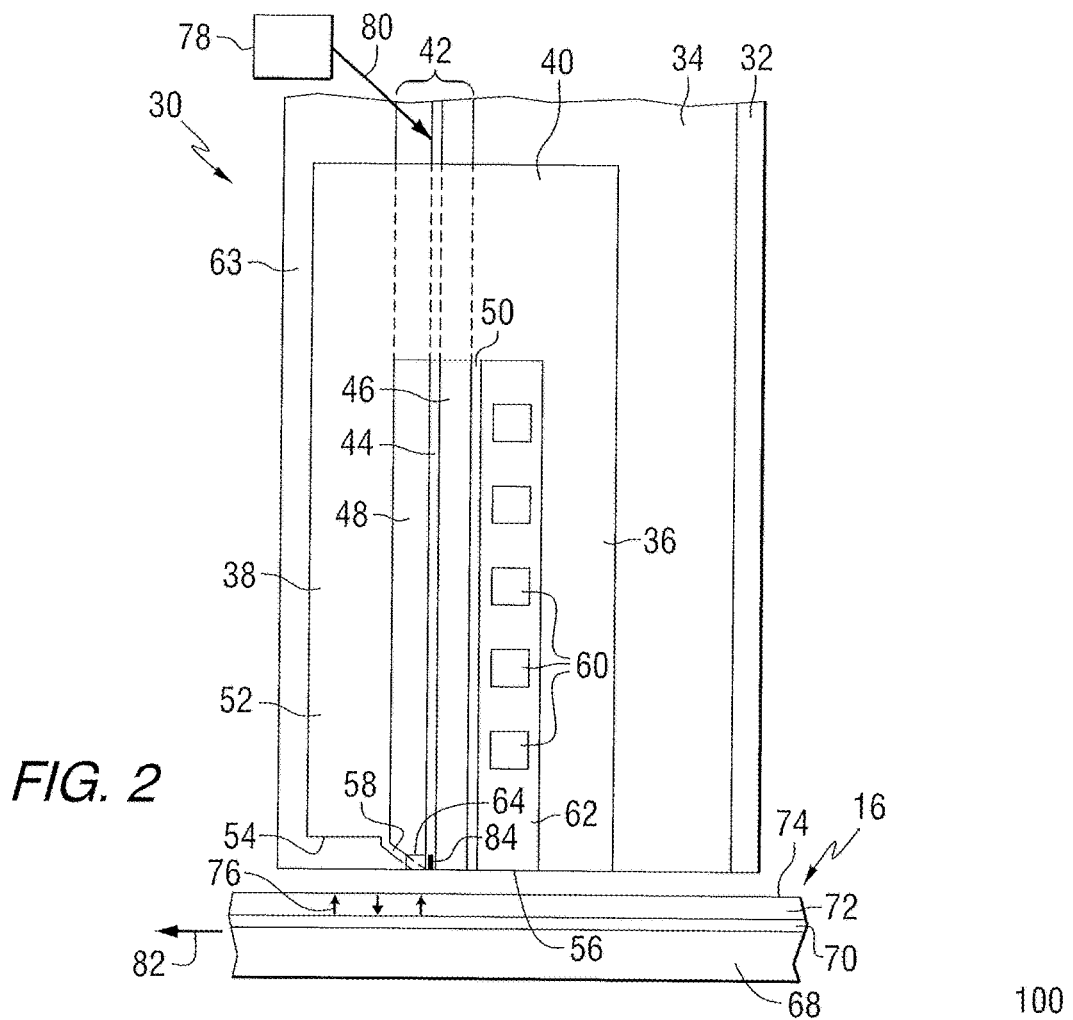
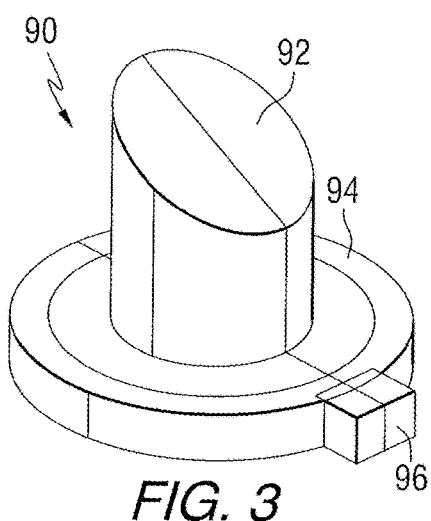
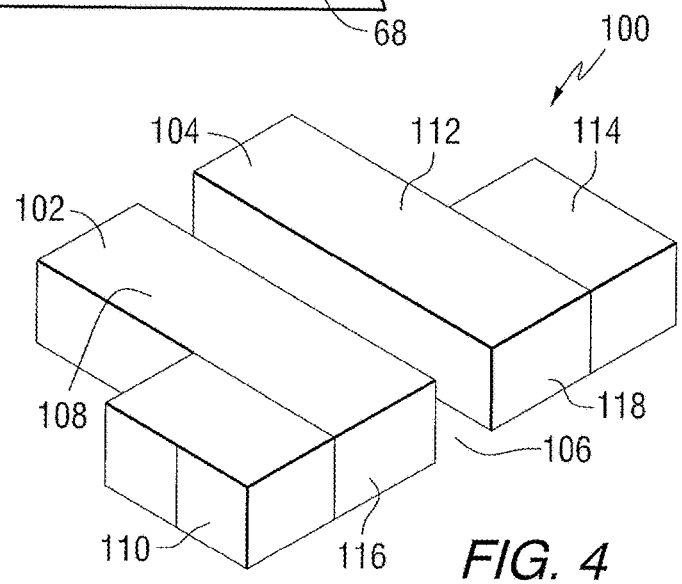
FIG. 2
FIG. 3
FIG. 4

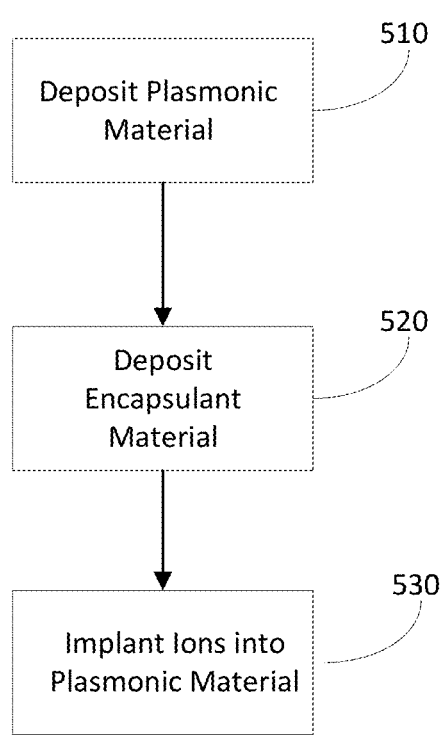
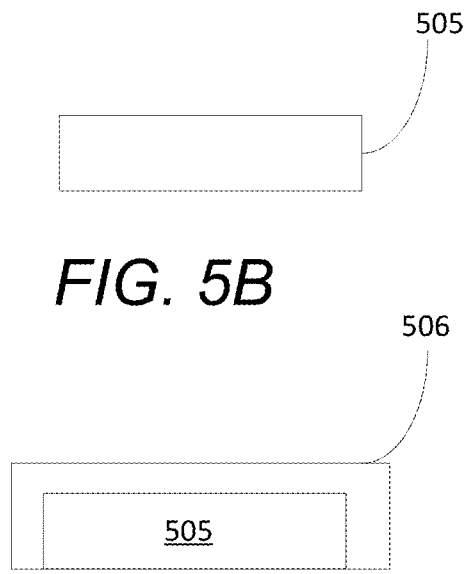
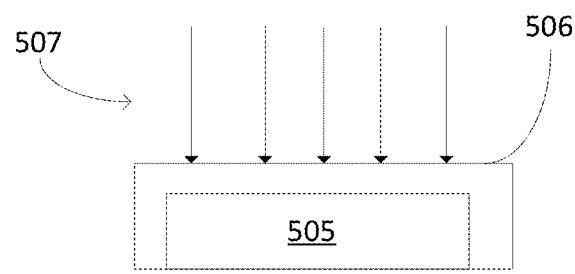
FIG. 5A
FIG. 5B
FIG. 5C
FIG. 5D

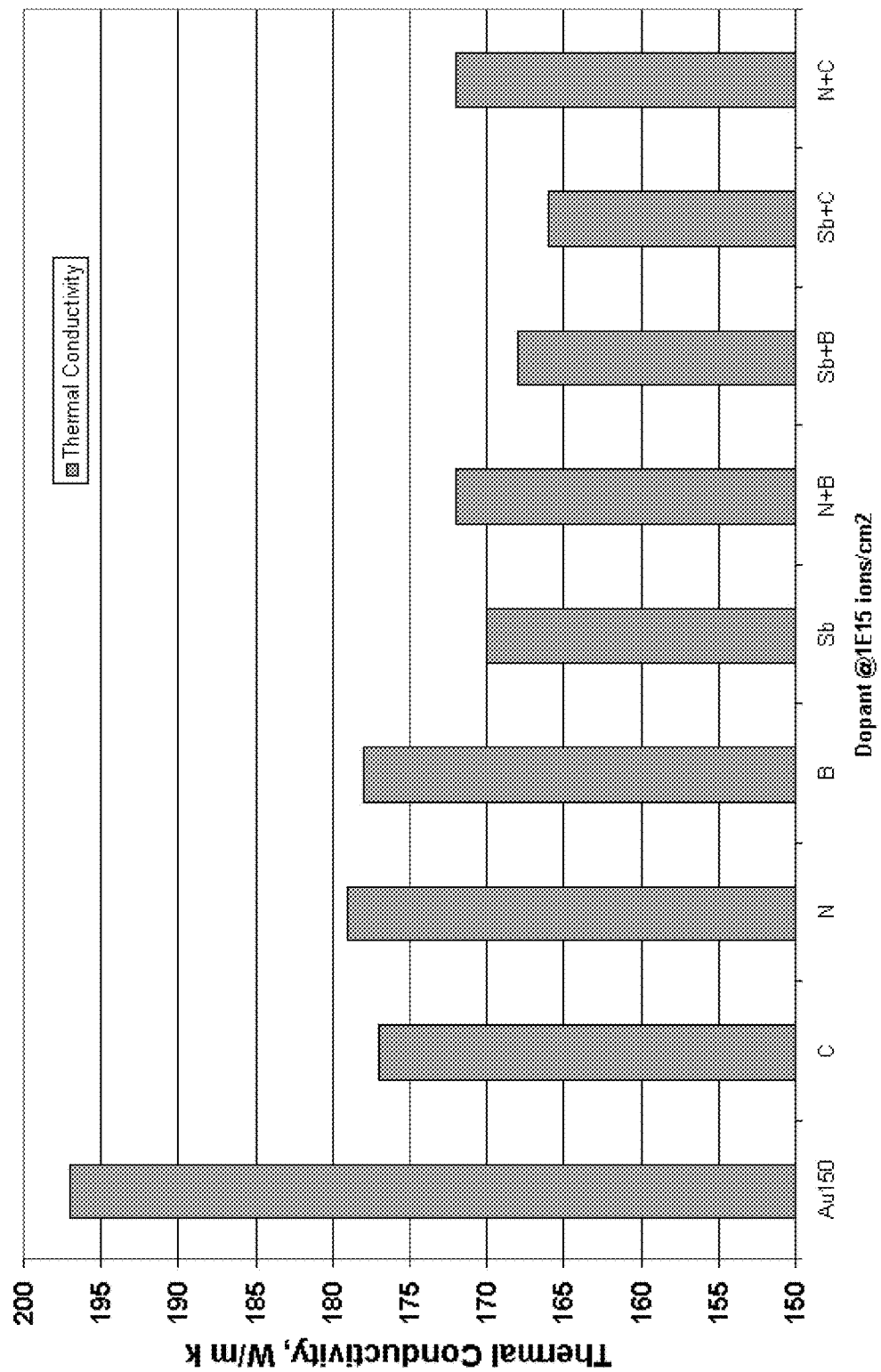

US 9,899,043 B2

METHODS OF FORMING NEAR FIELD TRANSDUCERS AND NEAR FIELD TRANSDUCERS FORMED THEREBY

PRIORITY

This application claims priority to U.S. Provisional Application Nos. 61/912,798 entitled "NFT ALLOY ION IMPLANTATION WITH NO DOPANT LOSS DURING PROCESSING" filed on Dec. 6, 2013 and 61/912,899 entitled "NFT ALLOY ION IMPLANTATION WITH NO DOPANT LOSS DURING PROCESSING" filed on Dec. 6, 2013, the disclosures of which are incorporated herein by reference thereto.

SUMMARY

Disclosed is a method of forming a near field transducer (NFT), the method including the steps of depositing a plasmonic material; depositing an encapsulant material on at least a portion of the plasmonic material; and implanting ions into at least a portion of the plasmonic material through the encapsulant material.

Also disclosed is a method of forming a near field transducer (NFT), the method including the steps of: depositing a plasmonic material; implanting a first dopant element into the plasmonic material; and implanting a second dopant element into the plasmonic material, wherein the second dopant element and the first dopant element have higher affinity for each other than they do the plasmonic material Further disclose is a method of forming a near field transducer (NFT), the method including the steps of: depositing a plasmonic material; depositing an encapsulant material on at least a portion of the plasmonic material; implanting ions into at least a portion of the plasmonic material through the encapsulant material; and forming a NFT from the plasmonic material.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

FIG. 2 is a side elevation view of a recording head constructed in accordance with an aspect of the invention.

FIG. 3 is a schematic representation of a near field transducer.

FIG. 4 is a schematic representation of another near field transducer.

FIG. 5A-5D depicts a disclosed method.

FIG. 12 shows the thermal conductivity of implanted gold (Au) films and a non-implanted Au film.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Heat assisted magnetic recording (referred to through as HAMR) utilizes radiation, for example from a laser, to heat media to a temperature above its curie temperature, enabling magnetic recording. In order to deliver the radiation, e.g., a laser beam, to a small area (on the order of 20 to 50 nm for example) of the medium, a NFT is utilized. During a magnetic recording operation, the NFT absorbs energy from a laser and focuses it to a very small area; this can cause the temperature of the NFT to increase. The temperature of the NFT can be elevated up to about 400° C. or more.

The very high temperatures that the NFT reaches during operation can lead to diffusion of the material of the NFT (for example gold) from the peg and towards the disk. In addition, a portion of the NFT may be exposed at the air bearing surface of the recording head and is thus subject to mechanical wearing. NFT performance is greatly influenced by the heat and mechanical stress during HAMR operation. In order to affect these properties, NFTs including a main plasmonic material and a doped material are often utilized.

NFT pegs, heat sinks, and discs made via doping and ion implantation with elements that are relatively light, for example boron (B), nitrogen (N), and carbon (C) tend to lose dopant to the free NFT film or patterned NFT peg/heat sink/disc surface. This is likely due to at least one of four possible reasons: the relatively small (e.g., often less than 1 atomic percent) dopant levels; the very thin films (e.g., often only a few tens of atomic layers thick); and the high mobility of the lighter dopant elements; and the tendency of the dopant elements to form surface oxides.

Disclosed herein are methods to form NFTs that attempt to maintain lighter dopant elements within the NFT, especially during processing.

Figure 1:
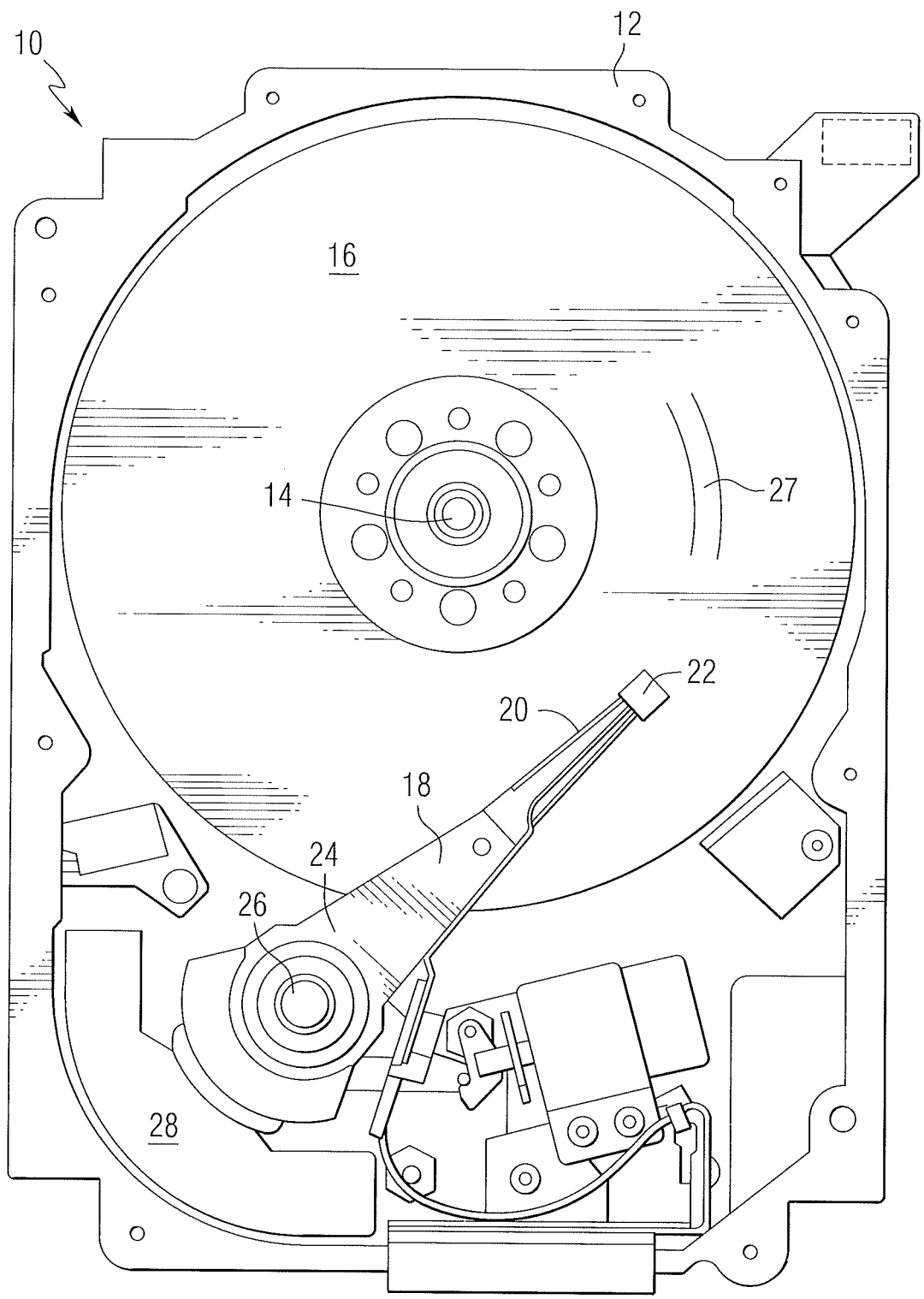
FIG. 1 is a pictorial representation of a data storage device in the form of a disc drive that can include a recording head constructed in accordance with an aspect of this disclosure.

Disclosed herein are NFTs and devices that include such NFTs. FIG. 1 is a pictorial representation of a data storage device in the form of a disc drive 10 that can utilize disclosed NFTs. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector or track 27 of the disc 16. The actuator motor 28 is regulated by a controller, which is not shown in this view and is well-known in the art. The storage media may include, for example, continuous media or bit patterned media.

For heat assisted magnetic recording (HAMR), electromagnetic radiation, for example, visible, infrared or ultraviolet light is directed onto a surface of the data storage media to raise the temperature of a localized area of the media to facilitate switching of the magnetization of the area. Recent designs of HAMR recording heads include a thin film waveguide on a slider to guide light toward the storage media and a near field transducer to focus the light to a spot size smaller than the diffraction limit. While FIG. 1 shows a disc drive, disclosed NFTs can be utilized in other devices that include a near field transducer.

FIG. 2 is a side elevation view of a recording head that may include a disclosed NFT; the recording head is positioned near a storage media. The recording head 30 includes a substrate 32, a base coat 34 on the substrate, a bottom pole 36 on the base coat, and a top pole 38 that is magnetically coupled to the bottom pole through a yoke or pedestal 40. A waveguide 42 is positioned between the top and bottom poles. The waveguide includes a core layer 44 and cladding layers 46 and 48 on opposite sides of the core layer. A mirror 50 is positioned adjacent to one of the cladding layers. The top pole is a two-piece pole that includes a first portion, or pole body 52, having a first end 54 that is spaced from the air bearing surface 56, and a second portion, or sloped pole piece 58, extending from the first portion and tilted in a direction toward the bottom pole. The second portion is structured to include an end adjacent to the air bearing surface 56 of the recording head, with the end being closer to the waveguide than the first portion of the top pole. A planar coil 60 also extends between the top and bottom poles and around the pedestal. In this example, the top pole serves as a write pole and the bottom pole serves as a return pole.

An insulating material 62 separates the coil turns. In one example, the substrate can be AlTiC, the core layer can be $Ta_2O_5$, and the cladding layers (and other insulating layers) can be $Al_2O_3$. A top layer of insulating material 63 can be formed on the top pole. A heat sink 64 is positioned adjacent to the sloped pole piece 58. The heat sink can be comprised of a non-magnetic material, such as for example Au.

As illustrated in FIG. 2, the recording head 30 includes a structure for heating the magnetic storage media 16 proximate to where the write pole 58 applies the magnetic write field H to the storage media 16. In this example, the media 16 includes a substrate 68, a heat sink layer 70, a magnetic recording layer 72, and a protective layer 74. However, other types of media, such as bit patterned media can be used. A magnetic field H produced by current in the coil 60 is used to control the direction of magnetization of bits 76 in the recording layer of the media.

The storage media 16 is positioned adjacent to or under the recording head 30. The waveguide 42 conducts light from a source 78 of electromagnetic radiation, which may be, for example, ultraviolet, infrared, or visible light. The source may be, for example, a laser diode, or other suitable laser light source for directing a light beam 80 toward the waveguide 42. Specific exemplary types of light sources 78 can include, for example laser diodes, light emitting diodes (LEDs), edge emitting laser diodes (EELs), vertical cavity surface emitting lasers (VCSELs), and surface emitting diodes. In some embodiments, the light source can produce energy having a wavelength of 830 nm, for example. Various techniques that are known for coupling the light beam 80 into the waveguide 42 may be used. Once the light beam 80 is coupled into the waveguide 42, the light propagates through the waveguide 42 toward a truncated end of the waveguide 42 that is formed adjacent the air bearing surface (ABS) of the recording head 30. Light exits the end of the waveguide and heats a portion of the media, as the media moves relative to the recording head as shown by arrow 82. A near-field transducer (NFT) 84 is positioned in or adjacent to the waveguide and at or near the air bearing surface. The heat sink material may be chosen such that it does not interfere with the resonance of the NFT.

Although the example of FIG. 2 shows a perpendicular magnetic recording head and a perpendicular magnetic storage media, it will be appreciated that the disclosure may also be used in conjunction with other types of recording heads and/or storage media, even those where it is not necessary to concentrate light to a small spot (e.g., recording heads other than HAMR heads).

FIG. 3 is a schematic view of a lollypop NFT 90 in combination with a heat sink 92. The NFT includes a disk shaped portion 94 and a peg 96 extending from the disk shaped portion. The heat sink 92 can be positioned between the disk shaped portion and the sloped portion of the top pole in FIG. 2. When mounted in a recording head, the peg may be exposed at the ABS and thus can be subjected to mechanical wearing.

FIG. 4 is a schematic view of a coupled nanorod (CNR) NFT 100. This NFT includes two nanorods 102 and 104 separated by a gap 106. Nanorod 102 includes a first portion 108 and a second portion 110. Nanorod 104 includes a first portion 112 and a second portion 114. When mounted in a recording head, the ends 116 and 118 of the nanorods may be exposed at the ABS and thus be subject to mechanical wearing. FIGS. 3 and 4 show example NFTs. However, the disclosure is not limited to any particular type of NFT. The methods described below may be used to fabricated various NFT configurations.

Disclosed herein are methods of forming NFTs. FIG. 5A is a flowchart showing an illustrative method. The depicted method includes steps 510, depositing a plasmonic material, step 520, depositing an encapsulant material at least some portion of the plasmonic material, and step 530 implanting dopants into the plasmonic material. An effect of the method is that the dopants are implanted through the encapsulant material. The encapsulant material does not detrimentally affect the implantation of the dopants, but serves to seal off the ambient air and/or oxygen during subsequent processing steps. FIGS. 5B to 5D show an illustrative deposited plasmonic material 505 (FIG. 5B), the illustrative plasmonic material 505 after the encapsulant material 506 has been deposited thereon (FIG. 5C), and dopant being implanted 507 through the encapsulant material 506 and into the plasmonic material 505 (FIG. 5D).

The first step, depositing a plasmonic material can be carried out using many different processes such as those that would be known to one of skill in the art. Illustrative plasmonic materials can include, for example gold (Au), silver (Ag), aluminum (Al), copper (Cu), ruthenium (Ru), rhodium (Rh), iridium (Ir), or alloys thereof; thermally conductive oxides, and indium tin oxide (ITO). In some embodiments, illustrative NFT materials can also include those disclosed in U.S. Patent Publication No. 2013/0286799, U.S. Pat. No. 8,427,925, and U.S. patent application Ser. No. 13/923,925 entitled MAGNETIC DEVICES INCLUDING FILM STRUCTURES, filed on Jun. 21, 2013, and Ser. No. 14/062,651 entitled RECORDING HEADS INCLUDING NFT AND HEATSINK, filed on Oct. 24, 2013, the disclosures of which are incorporated herein by reference thereto to the extent they do not conflict. The plasmonic material can be deposited using any deposition methods including for example sputter deposition, and electrochemical deposition.

A next step in disclosed methods is deposition of an encapsulant material on at least a portion of the plasmonic material. Encapsulant materials can include, for example a metal, a dielectric material, or different times of materials. In some embodiments, the encapsulant material is a dielectric material. Illustrative dielectric materials can include dielectric oxides such as alumina, silica, yttria, zirconia, tantala, titania, niobia, or combinations thereof, for example. The encapsulant layer can also include a metal or an alloy of a metal. In some embodiments, the encapsulant layer can also include a material such as diamond like carbon (DLC). In some embodiments, the encapsulant layer can include more than one layer of one or more than one different materials.

In some embodiments, a material for an encapsulant layer can be selected based on its compatibility with further processing that will be carried out on the article (e.g., wafer or rowbar processing). In some embodiments, the material can be a material that will be part of the larger device, or it can be one that can be removed (in some embodiments relatively easily removed) subsequent to implantation.

The encapsulant material is deposited on at least part of the plasmonic material. The encapsulant layer may function to seal off the surface of the plasmonic material from the exterior atmosphere thereby suppressing loss of the implanted dopant to the atmosphere during and after processing. Use of an encapsulant layer can be especially advantageous when implanting in relatively thin films or with dopants that have mobility or segregation tendencies. Use of an encapsulant layer may also help the plasmonic material maintain planarity during subsequent optional thermal annealing steps by preventing or minimizing possible thermal grooving of the grain boundaries.

The encapsulant layer can include metals, dielectric materials, or other materials. The encapsulant layer can have a thickness that is not less than 2 nm, or in some embodiments not less than 5 nm. In some embodiments, the encapsulant layer can have a thickness that is not greater than 100 nm, or in some embodiments not greater than 50 nm. In some embodiments, part of the encapsulant layer is consumed during the implantation process due to sputtering of the surface atoms. As such, the encapsulant layer thickness may be dynamically varied to intentionally shift the position of "Rp" and "delta Rp" (Rp is the statistical mean depth from the sample/film surface where the peak dopant concentration would occur; and delta Rp refers to the sigma or the spread of the dopant concentration profile across the thickness of the implanted film). The progressive shifting of the peak profile position "Rp" during the implant process can be advantageously used to control the dopant localization and mixing. Sometimes, while carrying out the implantation of an NFT or heat sink element through the encapsulant material, the constituent element of the oxide (in instances where the encapsulant material is an oxide) or the metal (in instances where the encapsulant is a metal) can also preferentially get knocked into the NFT or heat sink film during implant. The extent of this encapsulant film knock in in the underlying film can be controlled by controlling the encapsulant thickness, the implanted dose, energy, the implant beam angle, or some combination thereof.

Once the encapsulant layer has been deposited, the dopant can then be implanted. One of the potential issues with conventional sputtering techniques when sputtering alloy films (including for example a plasmonic material and a secondary material) is the possibility of the secondary material segregating and separating to the grain boundary during the deposition process. The problem can be exacerbated at lower film thicknesses or low dopant or alloying element concentrations, where the secondary element could diffuse out to the surface of the film. Lighter secondary elements have higher mobility and are therefore prone to higher diffusion. This could result in deviations of the composition of the NFT from a targeted composition. Formation of a NFT (or precursor) using disclosed methods may serve to alleviate such problems.

In some embodiments specific dopant implantation methods that can be utilized can include beam line implants, or plasma immersion implants for example. The ion beam used for implanting a dopant can be from a beam line producing a pure or skewed Gaussian profile, or a plasma ion immersion system forming an error function dopant profile. Implantation of the dopant can be carried out at elevated temperature or at cryogenic or cold temperature.

Any of the disclosed methods can be carried out on planar surfaces, on sloped or contoured surfaces, on surfaces with retrograde wall angles, or any combination thereof. Although formation of NFT elements are specifically contemplated and discussed herein, it will be understood by one of skill in the art that disclosed methods can also be utilized in the formation of heat sink elements, for example, as well.

In some embodiments, the dopant could have a substantially constant concentration across the NFT (or NFT precursor) or could have a concentration that changes. The profile of the dopants through the thickness of the film could be Gaussian, or could be an error function dopant distribution for example. In some embodiments, the dopant could be implanted at the same energy throughout the plasmonic material or could be implanted at different energies at different portions of the film. The energy of implantation can control, at least in part, the depth at which the dopant is implanted in the film of the plasmonic material. The energy for the implantation could be a single energy, or it could be a combination of energies for example. In embodiments where more than one energy is utilized, the profiles of each could additively be used to shape and tailor the final profile (e.g., the depth profile) of the dopant in the film.

In addition to through thickness tailoring of the composition profile, the composition could alternatively (or in combination) be spatially varied across the breadth or expanse of the film (e.g., the wafer diameter). For example, the center of the wafer could have a first composition profile while the edge of the wafer could have a second and different composition profile. In some embodiments more than one dopant could be implanted in a plasmonic material, each optionally having a chosen through thickness and across wafer composition profile. The sequence in which the dopants are implanted can be chosen such that the diffusivity and the crystallinity of the film can be advantageously affected.

The concentration of the dopant can be varied from several 10 s of ppm to several atomic percent. In some embodiments, the dopant can have a concentration that is not less than 10 ppm (or 0.001 atomic percent, at %), or in some embodiments not less than 100 ppm (0.01 at %). In some embodiments, the dopant can have a concentration that is not greater than 10 at %, or in some embodiments not greater than 5 at %. The concentration of the dopant can be controlled (e.g., metered in real time) using electrical methods, for example. Because control can be accomplished using electrical control, precise and repeatable control should be relatively easy to obtain. In some embodiments, when implanting three dimensional devices such as the heat sink and peg, the precise amount of dopant can also be controlled by varying the beam incidence angle on the wafer surface as well as the dwell time and angular rotational position of the wafer. The dose of the implant can be chosen such that the penalty to n and k are minimal.

Dopants that can be implanted herein are not limited, and any element can be implanted into the plasmonic material. In some embodiments, dopants that are lighter may benefit more from being utilized in disclosed methods. As such, illustrative dopants that can be considered can include, carbon (C), boron (B), and nitrogen (N), phosphorus (P), oxygen (O), or combinations thereof. In some embodiments, illustrative dopants can also include antimony (Sb), iron (Fe), cobalt (Co), iridium (Ir), platinum (Pt), tantalum (Ta), chromium (Cr), niobium (Nb), sodium (Na), strontium (Sr), calcium (Ca), scandium (Sc), beryllium (Be), lanthanum (La), yttrium (Y), hafnium (Hf), thorium (Th), or combinations thereof.

In some embodiments, more than one dopant can be implanted through the encapsulant layer, each with its own (same or different) implantation parameters. In some embodiments, the ion beam can be directed at a normal angle (90 degree) to the wafer or sample surface, or it can be incident at an angle ranging anywhere from 1 degree to 90 degrees, relative to the wafer or sample surface. In some embodiments, the sample can be stationary during the implantation, or it can be rotated at a fixed or variable rate of speed during implanting.

In some embodiments dopants may be incorporated into the plasmonic material through dopant implantation before the film or layer is formed into a NFT, or at a stage where the air bearing surface (ABS) of the NFT (and surrounding device) is being defined. In some embodiments, the encapsulant layer can be deposited after formation of the heat sink member (of the NFT). As such, embodiments may afford an encapsulant layer that covers the peg, the disc, the heat sink, or any combination thereof. The implanted species can be implanted by itself, or it can be preceded or followed up by another co-implanted species which serves to control the degree of crystallinity, the dopant profile before and after the implant. The co implant can be a substitutional or an interstitial species. In some embodiments, the co-implant can be a substitutional species.

Regardless of the timing of when the implantation is being done, the implantation can be done globally into the surface or it can be carried out in conjunction with a mask that allows only selected areas of the surface to be implanted.

Dopant implantation being undertaken during ABS definition can be done at various stages, including for example at rough lap, at final lap, after the first layer of head overcoat has been deposited, or after the entire layer of head overcoat has been deposited. In some embodiments, a Gaussian dopant profile can be implanted at rough lap, followed by a final lap, whose final thickness can be set to advantageously coincide with the 'Rp" of the implanted Gaussian distribution. In some embodiments, the ABS surface can be subject to plasma immersion ion implantation, with the error function like distribution of the dopant leading away from the ABS. In some embodiments, lithography methods may be advantageously combined with ion implantation to selectively dope and protect specific regions of the air bearing surface during implantation.

In some embodiments, more than one dopant, each with its own energy and dose profile can be implanted into the ABS rowbar, for example. Such implantation could be carried out to improve the performance of the NFT element, to advantageously modify the properties of the head overcoat, or both. The implantation can also be done to advantageously modify the corrosion resistance of the write pole material. Implantation carried out after the deposition of a partial or full head overcoat (which in such an embodiment would be the encapsulant material referred to in disclosed methods) may serve to "lock" the dopant inside the active device structure (write pole or NFT), thereby serving to improve its efficacy.

Implantation at an ABS processing stage can also optionally be combined with sequential oxidation processes to form thin metal oxides for protection purposes, for example.

Disclosed methods can also include additional steps that may be included in disclosed methods at various points in disclosed sequences. The flowchart in FIG. 6 depicts two illustrative methods that include various optional steps being carried out at various points in the illustrated methods.

Figure 6:
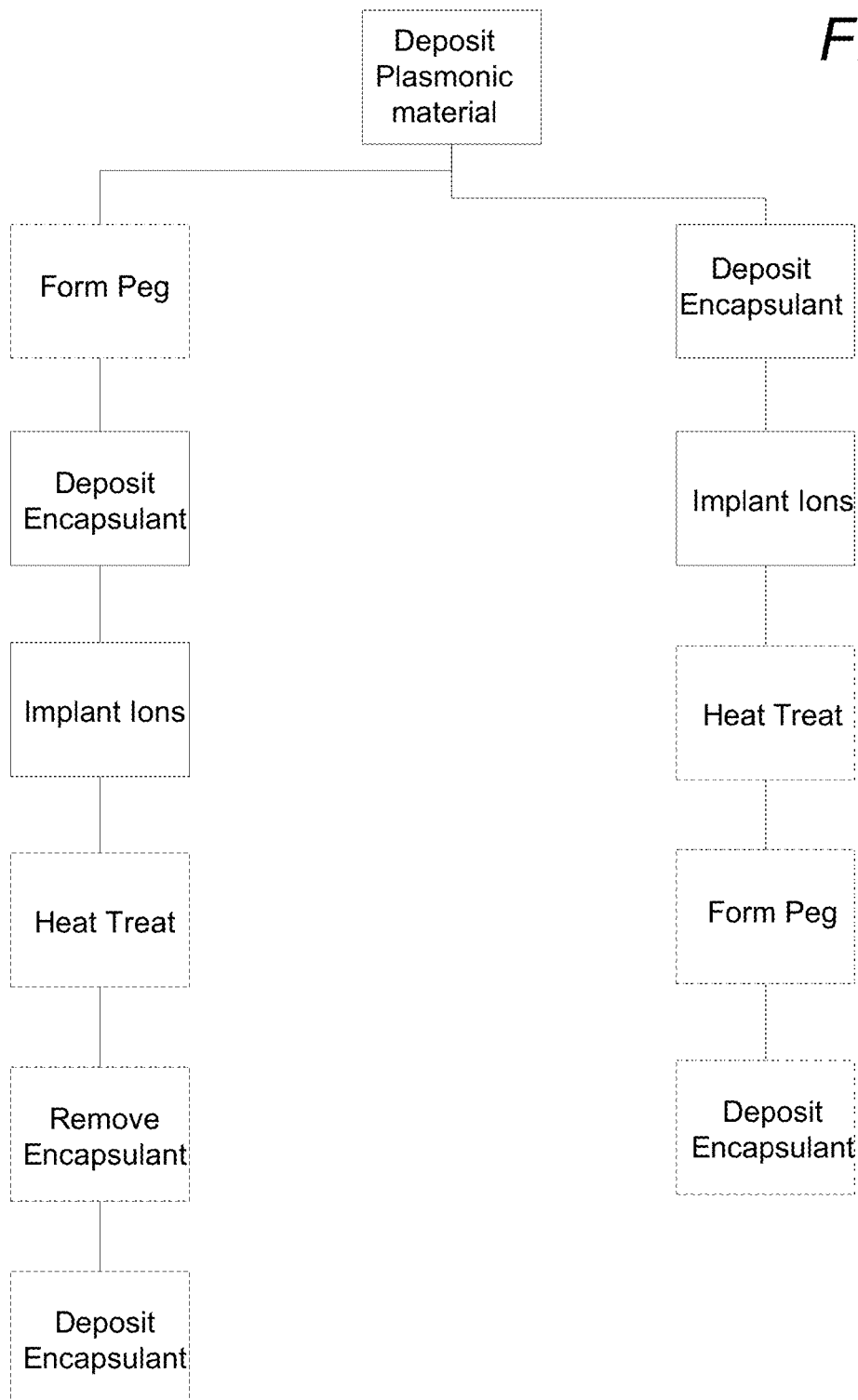
FIG. 6 depicts disclosed methods.

For example, as seen in the flowchart of FIG. 6, once the plasmonic material is deposited, the plasmonic material can optionally be formed into a peg. The deposited plasmonic material may contain a cap layer of a metal or dielectric. It should also be noted that such an optional peg formation step can be carried out after implantation of a dopant as well. Formation of a peg can include a patterning step (or steps) and can also include various removal methods. The step of forming a peg from the plasmonic material can include one or more than one step and can utilize known patterning processes including, for example photolithography, etching, etc. It should also be noted that plasmonic material can be formed into a disc, a heat sink, or both as well as or instead of a peg. It should also be noted that plasmonic material can be formed into other types (as opposed to a lollipop type that includes a peg and disc) of NFTs, as discussed above.

Another optional step that is seen in the flowchart of FIG. 6 is a heat treatment step. In some embodiments, an optional thermal treatment could be used to shape the dopant profile in the plasmonic material for example. In some embodiments, multiple thermal treatments, multiple implantation steps, or combinations thereof can be carried out. A thermal activation anneal may serve to drive implanted species to grain boundaries from the grain interior. If such a result is desired, the time-temperature schedule can be chosen to obtain such effects.

Such optional anneal steps can be included at various stages of disclosed methods. For example, the step of implanting a dopant can be preceded by, followed by (or both) laser, furnace, spike, rapid thermal anneal (RTA), or combination processes. The aim of such processes may be to advantageously modify and control the grain structure, point, line and volume defects of the plasmonic material for optimal reliability performance. These can include vacancies, clusters, grain size, degree of crystallinity or amorphousness, twin and stacking fault density, grain boundary intergranular phases, etc. It is understood that the implantation and annealing steps can be carried out at sheet film of a plasmonic metal or a suitably chosen binary or ternary plasmonic alloy at wafer or bar level.

The flowchart in FIG. 6 also shows optional steps that include removing encapsulant and a second step of depositing encapsulant. In some embodiments, it may be advantageous to remove a portion of the encapsulant layer after implantation through it has taken place. It could be advantageous because there may be some dopant atoms (or ions) in the encapsulant layer after implantation. The presence of such dopant atoms can diminish desired functions and properties that the encapsulant layer has in the device once fully processed and formed. As such, removing some portion of the encapsulant layer and re-depositing the encapsulant material after implantation has been completed can be advantageous. In some embodiments, a step of removing a portion of the encapsulant material does not remove the entirety of the encapsulant. This can be advantageous because it allows the barrier to gas (e.g., oxygen which could react with the dopant) to be present at all times.

Various other optional steps not specifically discussed herein can also be included, as would be aware to one of skill in the art to form a NFT, or a larger device that includes a NFT. NFTs, and larger devices including NFTs formed using disclosed methods are also disclosed herein.

Also disclosed herein are methods that include implantation of more than one dopant into the plasmonic material. Such methods can include depositing a plasmonic material, implanting a first dopant into the plasmonic material and implanting a second dopant into the plasmonic material. Details regarding the plasmonic material, deposition thereof, and processes and properties of implanting dopants discussed above can be applied to steps in such disclosed methods. The first dopant, the second dopant, and the plasmonic material in such disclosed methods can be chosen so that the mobility of the first and second dopants in the plasmonic material can be decreased by the coimplanted dopant. In some embodiments, it can be described that the first dopant has a chemical affinity for the second dopant and vice versa. The chemical affinity of the two dopants for each other lowers the chemical activity of both the dopants as well as their mobility. This may serve to reduce the surface migration and oxidation tendencies as well.

In some embodiments, the second dopant and the first dopant have a first affinity for each other, the first dopant has a second affinity for the plasmonic material, and the second dopant has a third affinity for the plasmonic material. The choice of the first and second dopants may be dictated by the ability of the first dopant to amorphize the NFT material, which can be later crystallized.

In some embodiments, the first and second dopant can be independently selected from: carbon (C), nitrogen (N), boron (B), and antimony (Sb). In some embodiments, the plasmonic material can be gold (Au), and the first and second dopant can be independently selected from: carbon (C), nitrogen (N), boron (B), and antimony (Sb).

While the present disclosure is not so limited, an appreciation of various aspects of the disclosure will be gained through a discussion of the examples provided below.

EXAMPLES

An illustrative process flow for carrying out a disclosed method can include the following: deposition of a primary element (e.g., a plasmonic material such as gold (Au), silver (Ag), copper (Cu), aluminum (Al), or a combination thereof) to form a primary element film or layer; definition of the peg of a NFT from the primary element film or layer using patterning methods such as photolithography for example; formation of the peg of a NFT using removal methods such as etching, etc.; encapsulation of the peg with a dielectric material; definition of an implant area using a mask; and implantation of a secondary element(s) in the implant area of the primary element film. In some embodiments, an optional heat treatment step can be carried out after the step of implanting the secondary element(s). In some embodiments, an optional step of removing at least part of the encapsulating dielectric material can be undertaken after implantation of the secondary element(s) (or optionally after the optional heat treatment). This can help control the interfacial and optical properties of the encapsulant film. If at least part of the encapsulating dielectric material was removed, another optional step may be added to redeposit some additional dielectric material (either the same dielectric material or a different dielectric material).

Another illustrative process flow for carrying out a disclosed method can include the following: deposition of a primary element (e.g., a plasmonic material such as gold (Au), silver (Ag), copper (Cu), aluminum (Al), or a combination thereof) to form a primary element film or layer; implantation of a secondary element(s) in the primary element film to form a NFT layer; definition of the peg of a NFT from the NFT layer using patterning methods such as photolithography for example; formation of the peg of a NFT using removal methods such as etching, etc. In some embodiments, an optional step of deposition of a dielectric material on the primary element film or layer can be carried out before the secondary element(s) is implanted. In some embodiments, an optional heat treatment step can be carried out after the step of implanting the secondary element(s). In some embodiments, an optional step of removing at least part of the encapsulating dielectric material can be undertaken after implantation of the secondary element(s) (or optionally after the optional heat treatment). This can function to remove dielectric material that may have secondary element(s) implanted therein. If at least part of the encapsulating dielectric material was removed, another optional step may be added to redeposit some additional dielectric material (either the same dielectric material or a different dielectric material) once the peg is formed.

Another illustrative process flow for carrying out a disclosed method can include the following: deposition of a primary element (e.g., a plasmonic material such as gold (Au), silver (Ag), copper (Cu), aluminum (Al), or a combination thereof) to form a primary element film or layer on a substrate that can contain other layers, structures, or both; definition of a plurality of pegs of NFTs from the primary element layer using patterning methods such as photolithography for example; formation of the plurality of pegs of the NFTs using removal methods such as etching, etc.; formation of a plurality of entire magnetic recording heads containing the pegs of the NFTs on the substrate; slicing the substrate into rows, each row containing a plurality of magnetic recording heads; forming at least a portion of an overcoat on the row; and implantation of a secondary element(s) in at least the peg regions of the primary element film to form alloyed NFTs. In some embodiments, an additional portion of the overcoat layer can be deposited after implantation of the at least one secondary element. In some embodiments a portion of the overcoat material may be advantageously removed and re-deposited to control the integrity and film stress of the head overcoat.

Ion implantation was carried out on a patterned NFT peg and heat sink which were encapsulated with 10 nm AlOx. Illustrative specific implantation parameters can include the following. For carbon (C), an implant voltage of 15 keV, a dose of 1 E14 ions/cm2 and 1 E15 ions/cm2, and a wafer tilt angle of 45 degrees. For nitrogen (N), an implant voltage of 18 keV, a dose of 1 E14 ions/cms and 1 E15 ions/cm2, and a wafer tilt angle of 45 degrees.

Another illustrative process flow for ion implantation through an encapsulated dielectric layer with the goal of achieving interfacial mixing at the interface between the Au/Heat sink and the NPS layer can include the following. In this case, an NFT layer is capped with a 10 nm Alumina layer, and subjected to implantation with an energy of 10 keV and a dose of between 1 E13 to 5 E15 ions/cm$^2$, in some examples with a dose between 1 E14 and 1 E15 ions/cm2. Dopant (e.g. Sb) is implanted so as to preferentially be located at the dielectric-metal interface, such as the CNS/NFT or the NPS/NFT, or the NPS/Heat Sink interface. Such a placement of the dopant within a few nanometers of the interface will lead to intentional mixing or rearrangement of the atoms at the interface due to primary atomic collisions as well as recoil collisions arising from the implanted atom. This will lead to advantageous interfacial stabilization at the NPS/heat sink interface.

In some embodiments it may be desirable to localize the dopant atom and the atomic scale mixing to within a few nms of the NFT/dielectric interface. If this is not undertaken, the presence of excess dopant atom concentration in the NFT may lead to the loss of plasmonic properties of the NFT material, or to excessively high optical propagation losses in the dielectric material. The dopant atom chosen for the interfacial mixing can be chosen so as to minimize the straggle or the lateral spread at the interface. Parameters such as the atomic weight, the incidence angle, the dose and the incident beam energy can be chosen so as to control the interfacial localization. Advantage can be taken of the steepness of the dopant profile gradient to place the interfacial mixing layer so as to minimize and control the dopant spread into the NFT layer to within a few nanometers. For the case of Beam implants, the position of the "Rp" parameter and the "delta Rp" parameter are carefully controlled so as to achieve the optimal interfacial mixing.

More than one dopant can thus be preferentially located at the interface. Subsequent to the implant step, the dopants can be appropriately activated so as to react with each other or with the dielectric layer, or the metal layer, to form an intermediary layer that aids in the bonding of the dielectric layer to the metal NFT element.

The encapsulant layer thickness can be varied from 2 nm to 100 nm. In some embodiments the encapsulant layer thickness is between 5 nm and 30 nm. Part of the encapsulant layer will be consumed during the implantation process due to sputtering of the surface atoms. The encapsulant layer thickness may be dynamically varied to intentionally shift the position of "Rp" and "delta Rp". The progressive shifting of the peak profile position 'Rp" during the implant process can be advantageously used to control the dopant localization and mixing. The implant recipe for such an interfacial mixing may be a multi-step recipe, with each step in the recipe operating at a particular dose and energy. If the thickness of the encapsulant layer diminishes during the implant, the beam energy is lowered in successive steps of the recipe so as to maintain the desired "Rp" position at the interface.

The tilt angle used for the interfacial mixing will depend on the device geometry (planar vs. contoured 3D structures, etc.). Larger tilt angle may lead to better mixing, but at the expense of larger ion/dopant path length through the encapsulant layer. Therefore a smaller fraction of the dopant would localize the interface, leading to a decrease in the implant efficiency.

Example 1: Implantation into Sheet Film NFT

Figure 7:
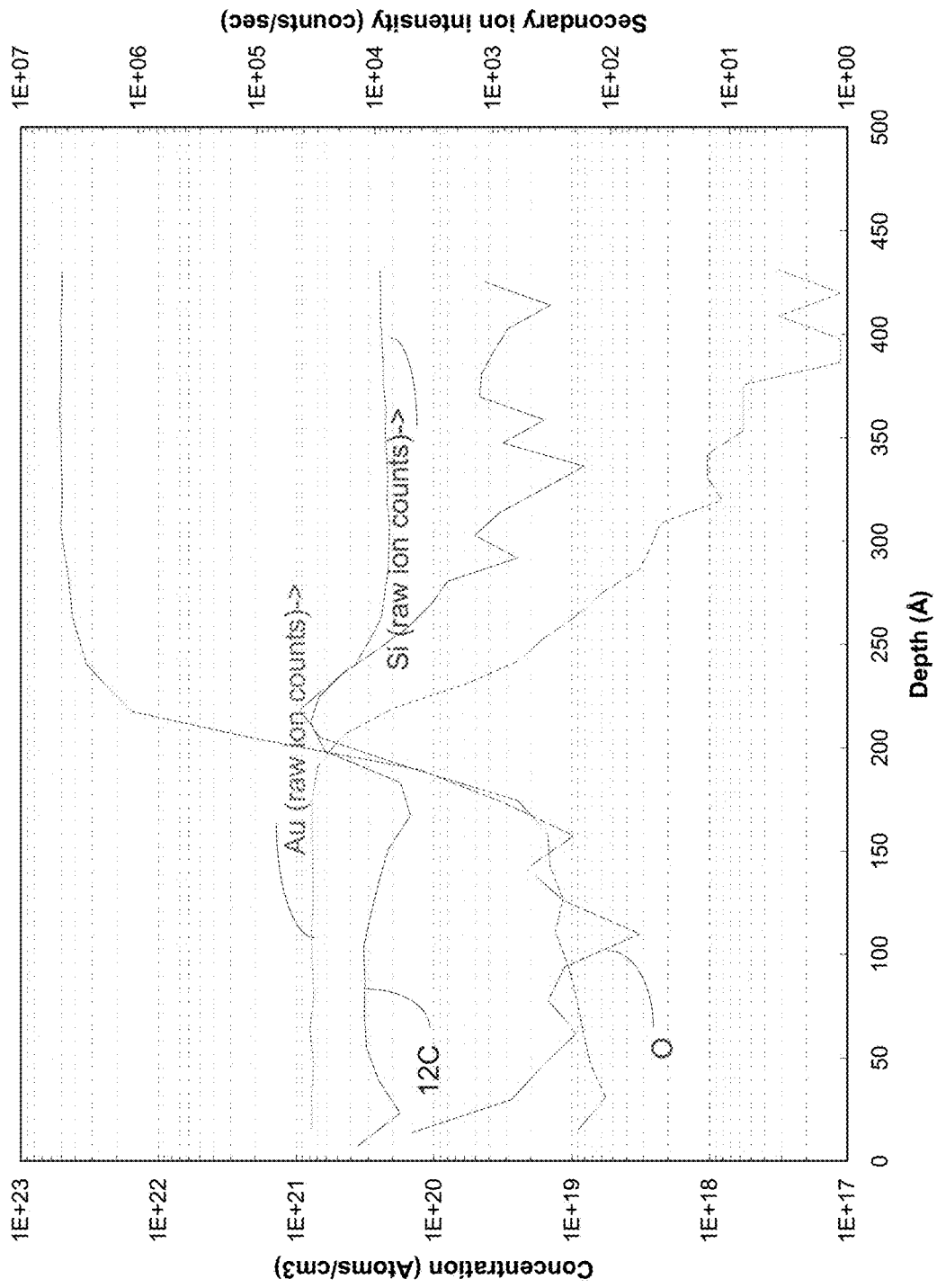
FIG. 7 shows a scanning ion mass spectroscopy (SIMS) profile through the thickness of a gold film from disclosed examples.

A gold film stack with the structure Au 25 nm\SiO2 was subject to implantation with Carbon under 6 keV accelerating voltage and a dose of 1 E15 ions/cm2 in a beam line implanter. The scanning ion mass spectroscopy (SIMS) profile through the thickness of the gold film is shown in FIG. 7. Left to right on the x axis, the top 200 to 250 Angstroms represents the approximate position of the gold film, values 250 A and higher represent the SiO2 film. The SIMS profile shows the incorporation of Carbon in the top Au film. The SIMS profile of Carbon shows the Gaussian shape characteristic of ion implantation. Furthermore, the peak in the C profile is centered around the midpoint of the Au film at approx 12.5 nm. Dropoff in the Carbon concentration in the underlying SiO2 film is also noted.

Example 2: Implantation into Sheet Film NFT

Figure 8:
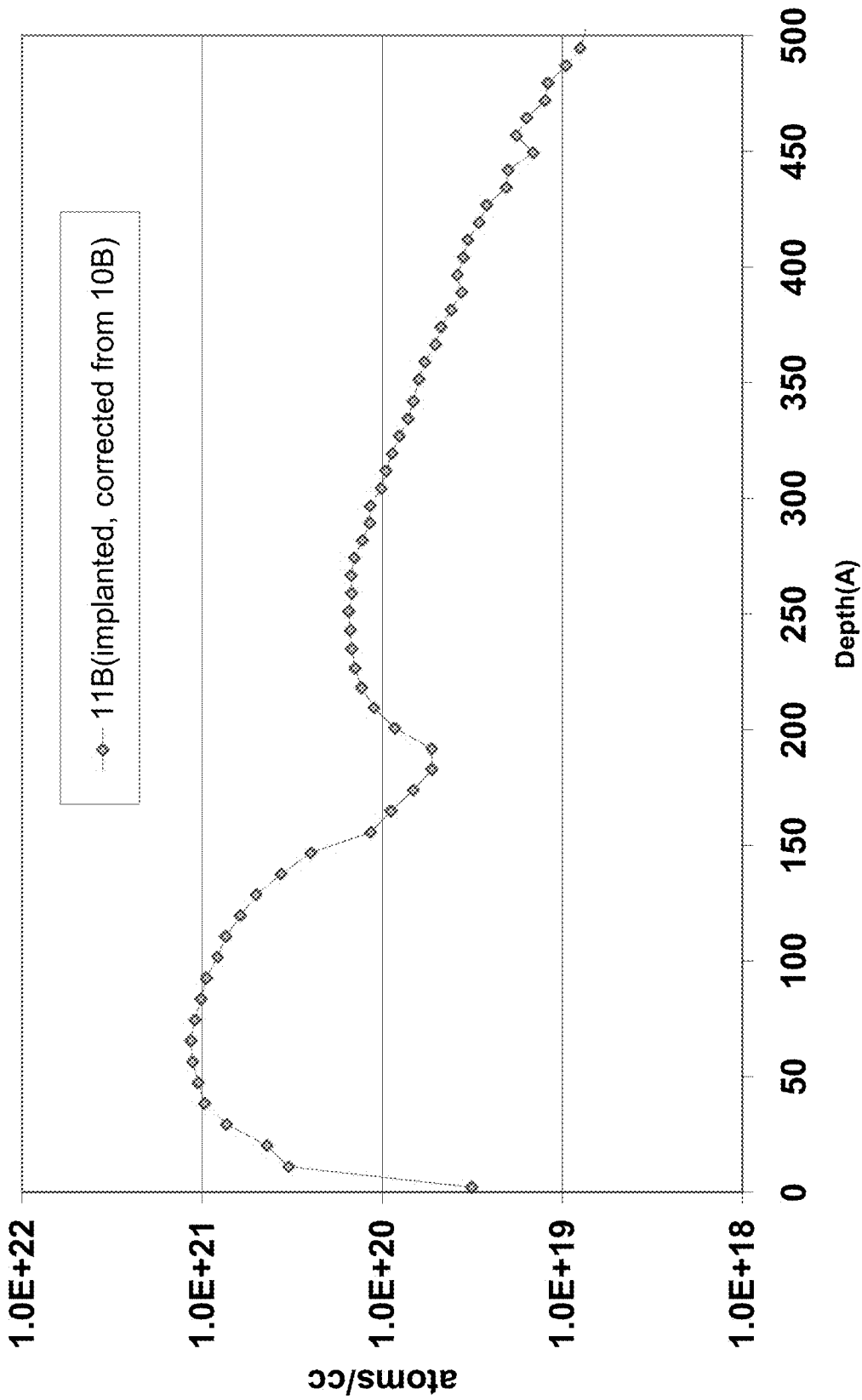
FIG. 8 shows a SIMS profile through the thickness of a gold film from disclosed examples.

A gold film stack with the structure Au 25 nm\SiO2 was subject to implantation with Boron under 5 keV accelerating voltage and a dose of 1 E15 ions/cm2 in a beam line implanter. The SIMS profile through the thickness of the gold film is shown in FIG. 8. The SIMS profile shows the incorporation of Boron in the top Au film. The SIMS profile of Boron shows the Gaussian shape characteristic of ion implantation. Furthermore, the peak in the B profile is centered around the midpoint of the Au film at approx 10-13 nm. Dropoff in the Boron concentration in the underlying SiO2 film is also noted. Precise control of the dopant location in the thickness of the film, as well as the precise metering of the dopant amount is possible with ion implantation.

Example 3: Implantation into Sheet Film NFT

Figure 9:
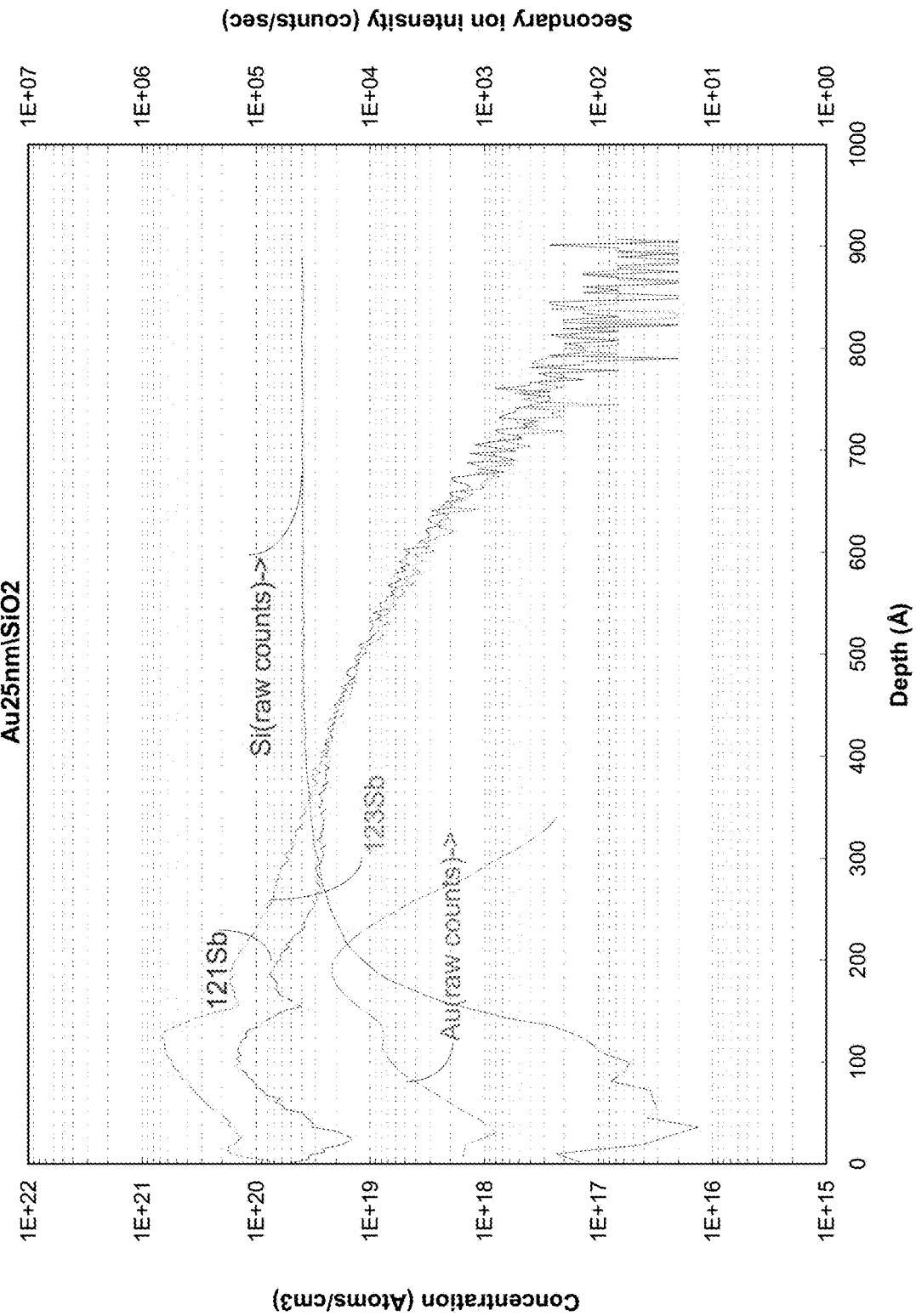
FIG. 9 shows a SIMS profile through the thickness of a gold film from disclosed examples.

A gold film stack with the nominal film structure Au 25 nm\SiO2 was subject to implantation with Antimony under 57 keV accelerating voltage and a dose of 1 E15 ions/cm2 in a beam line implanter. The SIMS profile through the thickness of the gold film is shown in FIG. 9. The SIMS profile shows the incorporation of Antimony (Sb) in the top Au film. The SIMS profile of Sb shows the Gaussian shape characteristic of ion implantation. Furthermore, the peak in the Sb profile is centered around the midpoint of the Au film at approx 10-13 nm. Dropoff in the Sb concentration in the underlying SiO2 film is also noted.

Example 4: Implantation into Sheet Film NFT

A set of gold films with the nominal film structure Au 25 nm\SiO2 was subject to implantation in a beam line ion implanter with various ions under the accelerating voltage and a dose conditions shown in Table I below. The optical properties of the film were measured after the implant and are shown below. For comparison, the optical properties of the unimplanted Au film are also shown. Data indicates that the optical plasmonic properties of the Au film are not significantly degraded as a result of the incorporation of the dopant species via ion implantation in the Au film. Thermal annealing of the Au films after the implant step will heal the lattice damage from the implantation process and further improve the optical plasmonic properties.

TABLE I

| Optical Properties of Au films after ion Implantation | | | |
|---|---|---|---|
| Implant Species and Implant Voltage | Implant Dose, ions/cm2 | n | k |
| N - 7.2 keV | 1.00E+12 | 0.234 | 5.37 |
|  | 1.00E+13 | 0.237 | 5.42 |
|  | 1.00E+14 | 0.237 | 5.41 |
|  | 1.00E+15 | 0.243 | 5.37 |
| B- 5 keV | 1.00E+12 | 0.236 | 5.41 |
|  | 1.00E+13 | 0.239 | 5.45 |
|  | 1.00E+14 | 0.245 | 5.43 |
|  | 1.00E+15 | 0.253 | 5.42 |
| C | 1.00E+12 | 0.232 | 5.41 |
|  | 1.00E+13 | 0.235 | 5.43 |
|  | 1.00E+14 | 0.248 | 5.43 |
|  | 1.00E+15 | 0.252 | 5.4 |
| Au - No Implant |  | 0.223 | 5.43 |

Figure 10:
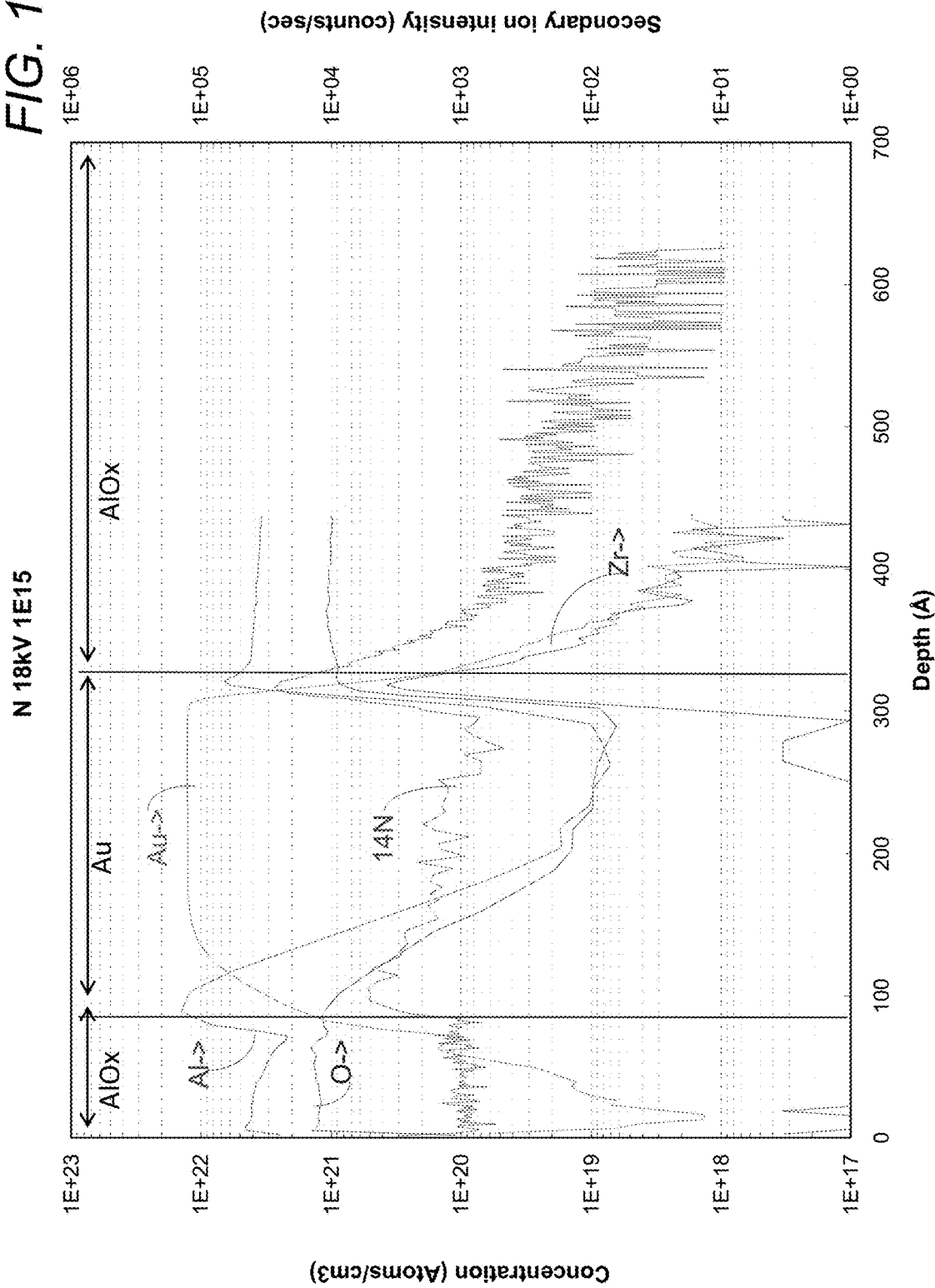
FIG. 10 shows a SIMS profile through the thickness of a gold film from disclosed examples.

Example 5: Implantation Through Encapsulated NPS Dielectric Layer into NFT and/or Heat Sink An alumina encapsulated gold film stack with the structure AlOx 10 nm\Au 25 nm\AlOx was subject to implantation with Nitrogen under 18 keV accelerating voltage and a dose of 1 E15 ions/cm2 in a beam line implanter. The SIMS profile through the thickness of the AlOx25 nm\Au 25 nm\AlOx film stack is shown in FIG. 10. Left to right on the x axis, the top 100 Angstrons nominally represents the topmost Alumina, the next 200 to 250 Angstroms nominally represents the approximate position of the gold film, values further to the right and higher represent the underlying Alumina film. The SIMS profile shows the incorporation of Nitrogen in the middle sandwiched Au film. The SIMS profile of Nitrogen shows the Gaussian shape characteristic of ion implantation. Dropoff in the Nitrogen concentration in the underlying AlOx film is also noted. Dopant injection through the encapsulated alumina layer into the underlying (Au) NFT film preserves the dopant in the film and prevents dopant loss from the NFT film during subsequent process steps in the wafer build.

Example 6: Implantation into Dielectric Film Stacks

A set of dielelctric stack films incorporating the cladding and core layers was subject to implantation in a beam line ion implanter with various ions under the accelerating voltage and a dose conditions shown in table II below. The optical loss properties of the film stacks as well as the refractive index of the core layer were measured before and after the implant and are shown below in a dielectric loss (db/cm) tester. Refractive index of the core layer was also measured. Data indicates that the optical losses as well as the core layer refractive index in the dielectric film stack are not significantly degraded as a result of the incorporation of the dopant species via ion implantation in the dielectric film stack.

TABLE II

| Species | Energy (keV) | Dose | Tilt/Twist | Pre Loss Measurement | | Post Loss Measurement | |
|---|---|---|---|---|---|---|---|
| | | | | Loss (633 nm) | Loss (825 nm) | Loss (633 nm) | Loss (825 nm) |
| C | 15 | 1E15 | 45/0/16 step | 1.81 | 0.51 | 1.78 | 1.8 |
| N | 18 | 1E15 | 45/0/16 step | 1.53 | 0.61 | 1.66 | 1.63 |
| Sb | 30 | 1E14 | 45/0/16 step | 1.56 | 0.45 | 1.76 | 0.8 |
| Sb | 30 | 5E14 | O tilt/0/16 step | 1.79 | 0.33 | 2.22 | 0.9 |
| B | 12 | 1E15 | 45 tilt/0/16 step | 1.95 | 0.73 | 1.87 | 2.54 |

Example 7: Implantation Through Encapsulated NFT

Figure 11:
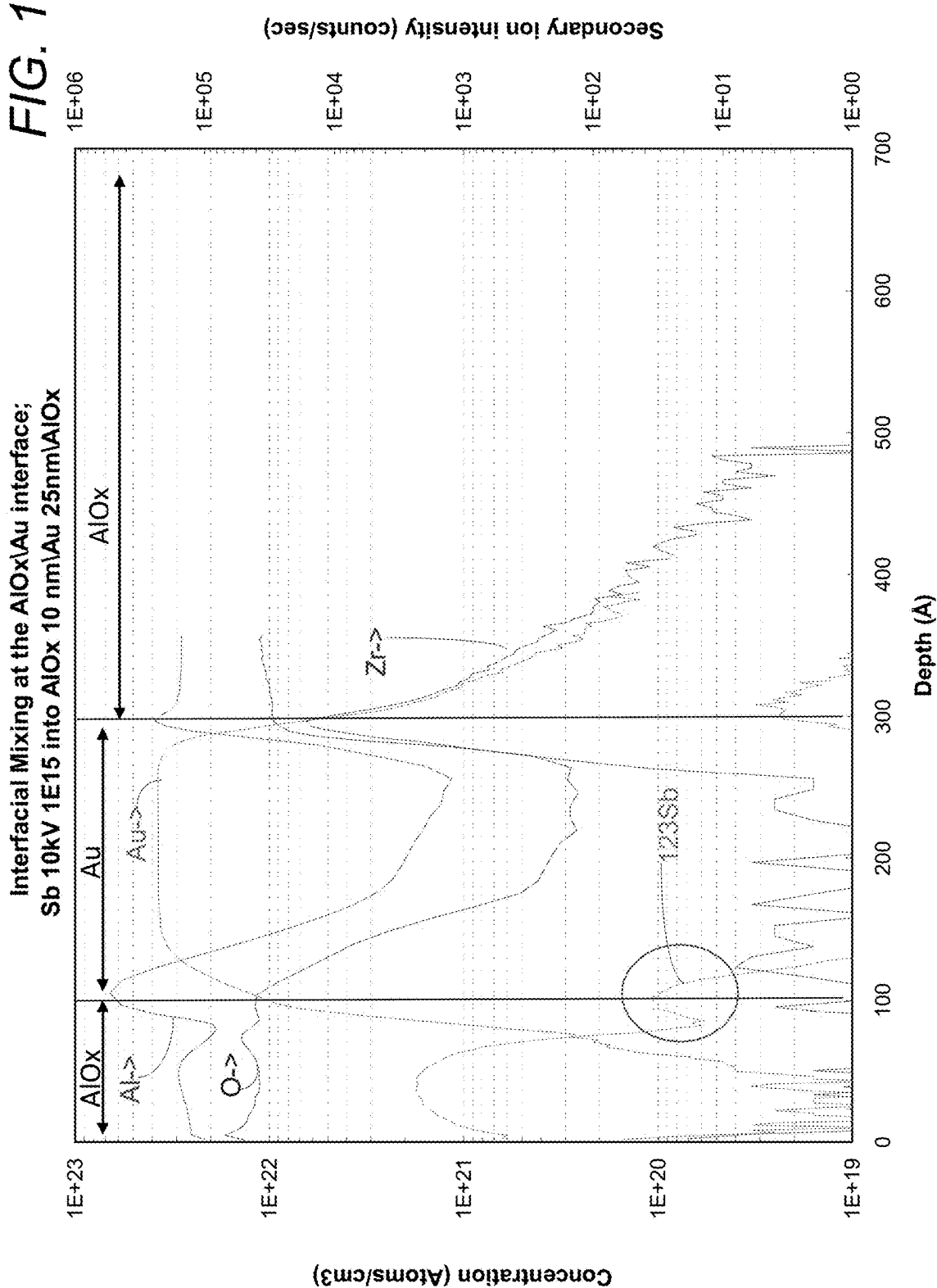
FIG. 11 shows a SIMS profile through the thickness of a gold film from disclosed examples.

Implantation for the purpose of interfacial mixing at the top Alumina\Gold interface: An alumina encapsulated gold film stack with the nominal structure AlOx 10 nm\Au 25 nm\AlOx was subject to implantation with Antimony under 10 keV accelerating voltage and a dose of 1 E15 ions/cm2 in a beam line implanter. The purpose of the implantation is to target the majority of the dose at the precise location of the top Alumina\Au interface, 10 nm below the surface of the top Alumina encapsulation layer. The goal is to achieve atomic intermixing at the interface due to the implanted atomic species (Sb). The SIMS profile through the thickness of the AlOx25 nm\Au 25 nm\AlOx film stack is shown in FIG. 11. Left to right on the x axis, the top 100 Angstrons nominally represents the topmost Alumina, the next 200 to 250 Angstroms nominally represents the approximate position of the gold film, values further to the right and higher represent the underlying Alumina film. The SIMS profile shows the local peak in the Sb concentration just at the position of the top Alumina\Au interface, located 10 nm below the surface. This is circled in red in the figure below. Furthermore, the spread of this intermixed layer is confined to a few nms on either side of the Au/Alumina interface. The SIMS profile of Sb shows the Gaussian shape characteristic of ion implantation. Dropoff in the Sb concentration in the underlying Au film is also noted. Thus precise location of the interfacial mixing can be controlled with the ion energy and the implant angle, while the degree of interfacial mixing can be controlled with the dose.

Example 8: Coimplantation 150 nm Au films were subjected to implant doses of single or multiple species, with the dose of each species corresponding to 1 E15 ions/cm2. The Au films were implanted with the following dopants: C–1 E15; N–1 E15; B–1 E15; Sb–1 E15; C–1 E15+N–1 E15; N–1 E15+B–1 E15; B–1 E15+Sb 1 E15; Sb–1 E15+B–1 E15; and Sb–1 E15+C–1 E15. The energy of the implants was chosen so as to place the Rp at the center of the film thickness, 75 nm. The thermal conductivity of the as implanted Au films was measured, and can be seen in FIG. 12. As seen, a modest 10% drop in thermal conductivity was observed due to the implants. This could likely be recovered by annealing.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of methods of forming near field transducers and near field transducers formed thereby are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A method of forming a near field transducer (NFT), the method comprising the steps of:
   depositing a plasmonic material;
   depositing an encapsulant material on at least a portion of the plasmonic material;
   implanting ions into at least a portion of the plasmonic material through the encapsulant material; and
   annealing the plasmonic material.

2. The method according to claim 1, wherein the plasmonic material is at least partially fabricated before the encapsulant material is deposited thereon.

3. The method according to claim 2, wherein at least partially fabricated comprises defining a peg, forming a peg, or some combination thereof.

4. The method according to claim 1, wherein the encapsulant material is deposited on plasmonic material that forms a peg of a NFT, on plasmonic material that forms a disc of a NFT, or on plasmonic material that forms both a peg and a disc of a NFT.

5. The method according to claim 1, wherein the encapsulant material comprises dielectric material.

6. The method according to claim 1, wherein the encapsulant material is deposited to a thickness from about 2 nm to about 50 nm.

7. The method according to claim 1, wherein implanting ions into at least a portion of the plasmonic material comprises patterning steps.

8. The method according to claim 1 further comprising etching at least a portion of the encapsulant material after implanting ions into at least a portion of the plasmonic material.

9. The method according to claim 1 further comprising depositing additional encapsulant material after implantation of ions into at least a portion of the plasmonic material.

10. A method of forming a near field transducer (NFT), the method comprising the steps of:
    depositing a plasmonic material;
    implanting a first dopant element into the plasmonic material;
    implanting a second dopant element into the plasmonic material; and
    annealing the plasmonic material,
    wherein the second dopant element and the first dopant element have higher affinity for each other than they do the plasmonic material.

11. The method according to claim 10, wherein the first dopant can amorphize the plasmonic material.

12. The method according to claim 10, wherein the plasmonic material is gold (Au).

13. The method according to claim 12, wherein the first and second dopant are independently selected from: carbon (C), nitrogen (N), boron (B), and antimony (Sb).

14. A method of forming a near field transducer (NFT), the method comprising the steps of:
    depositing a plasmonic material;
    depositing an encapsulant material on at least a portion of the plasmonic material;
    implanting ions into at least a portion of the plasmonic material through the encapsulant material;
    forming a NFT from the plasmonic material; and
    annealing the plasmonic material.

15. The method according to claim 14, wherein the NFT is formed from the plasmonic material before the encapsulant material is deposited thereon.

16. The method according to claim 14 further comprising etching at least a portion of the encapsulant material after implanting ions into at least a portion of the plasmonic material and depositing additional encapsulant material after implantation of ions into at least a portion of the plasmonic material.

17. The method according to claim 1, wherein implanting ions into at least a portion of the plasmonic material comprises patterning steps.

18. The method according to claim 1, wherein the plasmonic material is annealed after implanting ions into at least a portion of the plasmonic material.

19. The method according to claim 10, wherein the plasmonic material is annealed after implanting ions into at least a portion of the plasmonic material.

20. The method according to claim 14, wherein the plasmonic material is annealed after implanting ions into at least a portion of the plasmonic material.

* * * * *